(12) United States Patent
Yang et al.

(10) Patent No.: US 7,569,447 B2
(45) Date of Patent: Aug. 4, 2009

(54) METHOD OF FORMING TRANSISTOR STRUCTURE HAVING STRESSED REGIONS OF OPPOSITE TYPES

(75) Inventors: Haining S. Yang, Wappingers Falls, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 198 days.

(21) Appl. No.: 11/879,065

(22) Filed: Jul. 16, 2007

(65) Prior Publication Data
US 2007/0259489 A1  Nov. 8, 2007

Related U.S. Application Data

(62) Division of application No. 10/905,586, filed on Jan. 12, 2005, now Pat. No. 7,271,442.

(51) Int. Cl.
*H01L 21/8238* (2006.01)

(52) U.S. Cl. .................. 438/199; 438/275; 257/E21.632
(58) Field of Classification Search .................. 438/153, 438/199, 275, 279, 404; 257/E21.632
See application file for complete search history.

(56) References Cited

U.S. PATENT DOCUMENTS

2006/0003597 A1* 1/2006 Golonzka et al. ........... 438/778

* cited by examiner

*Primary Examiner*—Thanhha Pham
(74) *Attorney, Agent, or Firm*—H. Daniel Schnurmann; Daryl K. Neff

(57) ABSTRACT

A method of fabrication is provided in which a field effect transistor (FET) is formed having a channel region and source and drain regions adjacent to the channel region. A first stressed region underlies the channel region, in which the first type of stress is either compressive type or tensile type. Second stressed regions having a second type of stress underlie the source and drain regions, in which the second type of stress is an opposite one of the compressive type or tensile type stress of the first stressed region.

20 Claims, 9 Drawing Sheets

METHOD OF FORMING TRANSISTOR STRUCTURE HAVING STRESSED REGIONS OF OPPOSITE TYPES

CROSS-REFERENCE TO RELATED APPLICATION

This application is a division of U.S. application Ser. No. 10/905,586 filed Jan. 12, 2005, now U.S. Pat. No. 7,271,442, the disclosure of which is hereby incorporated herein by reference.

BACKGROUND OF THE INVENTION

The present invention relates to semiconductor integrated circuits and their fabrication.

The performance of a transistor can be improved by applying a stress of a correct type and sufficient magnitude to the channel region of the transistor. However, heretofore, structures and processes used to form regions that apply such stress have frequently been complicated and some have been difficult to perform from a perspective of process control.

Accordingly, it would be desirable to provide a structure and method of fabricating the same, by which a desirable amount of stress of a particular type, e.g., compressive type or tensile type stress, is applied to the channel region of a transistor.

SUMMARY OF THE INVENTION

According to one aspect of the invention, an integrated circuit and method of fabrication are provided in which the integrated circuit includes a field effect transistor (FET) having a channel region and source and drain regions adjacent to the channel region. A first stressed region having a first type of stress is provided to underlie the channel region, in which the first type of stress is either compressive type or tensile type. Second stressed regions having a second type of stress are provided to underlie the source and drain regions, in which the second type of stress is an opposite one of the compressive type or tensile type stress of the first stressed region. For example, a PFET is provided which includes a channel region overlying a tensile-stressed region and source/drain regions overlying compressive-stressed regions. In another example, an NFET is provided which includes a channel region overlying a compressive-stressed region and source/drain regions overlying tensile-stressed regions.

According to other aspects of the invention, a method is provided for fabricating a transistor to have the above-described structure.

DETAILED DESCRIPTION

Figure 1A:
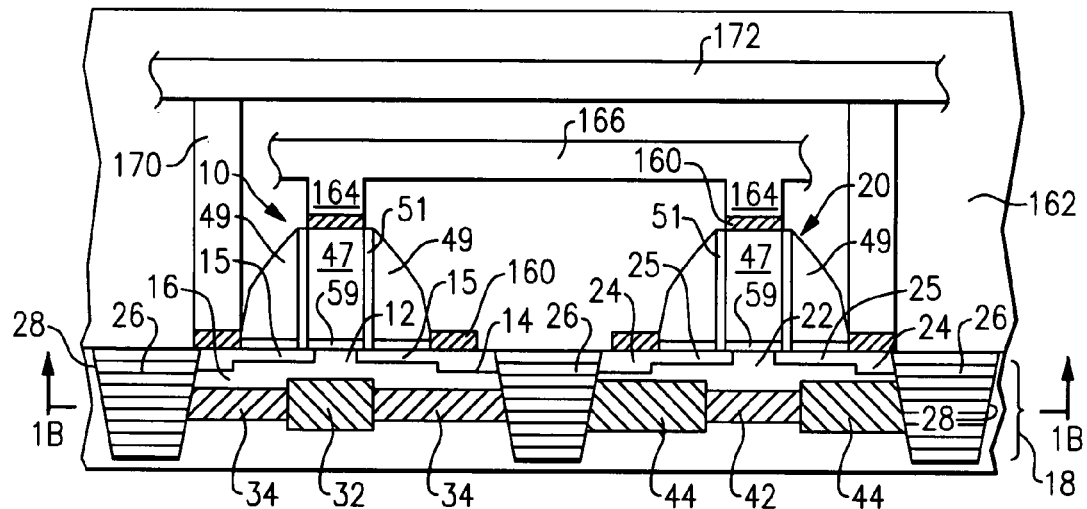
FIGS. 1A and 1B are a sectional view and a corresponding plan view through lines 1B-1B, respectively, of an integrated circuit structure including a PFET and an NFET according to an embodiment of the invention.

FIG. 1A is a sectional view of an integrated circuit structure which includes transistors in accordance with an embodiment of the invention. The integrated circuit includes a p-type field effect transistor 10 ("PFET") having a channel region 12, a pair of source/drain regions 14 adjacent to the channel region 12 in a single-crystal semiconductor layer 16 of a substrate 18 and a pair of extension/halo regions 15 between the channel region 12 and the source/drain regions. An n-type field effect transistor ("NFET") 20 is also disposed in the single-crystal semiconductor layer 16, the NFET having a channel region 22, a pair of source/drain regions 24 adjacent to the channel region 22 and extension/halo regions 25 disposed between the source/drain regions and the channel region 22. As shown in FIG. 1A, and as also shown in the subsurface plan view of FIG. 1B, the PFET 10 and the NFET 20 are each surrounded by, and isolated from each other by a shallow trench isolation (STI) region 26, the isolation region providing near or total electrical isolation between the portions of the PFET 10 and the NFET 20 disposed in the semiconductor layer 16, and between the PFET 10, the NFET 20 and other devices which may be present in areas of the substrates disposed outside the peripheral edges 28 of the STI regions.

As further shown in FIG. 1A, the channel region and source/drain regions of each transistor overlie elongated buried regions which contain a stressed dielectric material, the stressed regions used to impart beneficial stresses at the interface between the channel regions and source/drain regions of the transistors. Specifically, the channel region 12 of the PFET 10 is disposed overlying a buried tensile-stressed dielectric region 32, and the source/drain regions 14 overlie a pair of compressive-stressed dielectric regions 34 disposed adjacent to the tensile-stressed dielectric region 32. These stressed dielectric regions are preferably disposed under the entire areas of the corresponding channel and source/drain regions of the transistor. On the other hand, the channel region 22 of the NFET 20 overlies a buried compressive-stressed dielectric region 42, and the source/drain regions 24 overlie tensile-stressed dielectric regions 44. These stressed dielectric regions are preferably disposed under the entire areas of the corresponding channel and source/drain regions of each transistor such that the channel region of the PFET is entirely disposed over the tensile-stressed dielectric region 32, and the source/drain regions of the PFET are entirely disposed over the compressive-stressed dielectric regions 34. Similarly, the channel and source/drain regions of the NFET are preferably entirely disposed over corresponding stressed dielectric regions.

The buried stressed dielectric regions under the PFET 10 are used to impart a high compressive stress at the boundaries between the channel region 12 of the PFET 10 and the adjacent source/drain regions 14 for increasing the velocity of holes through the PFET, and thus, to increase the conductivity of the PFET. The buried stressed dielectric regions 42, 44 which underlie the NFET impart a high tensile stress at the boundaries between the channel region 22 of the NFET 20 and the source/drain regions 24 on each side thereof, for the purpose of increasing the velocity of electrons through the NFET, thus increasing the conductivity of the NFET.

As further shown in FIG. 1A, each of the PFET 10 and the NFET 20 includes a gate conductor 47 which overlies the corresponding channel region 12 or 22 of the transistor, and each transistor further includes spacers 49 disposed adjacent to the sidewalls of the gate conductor 47. The gate conductors 47 may consist essentially of a polycrystalline semiconductor such as polysilicon, or alternatively of a metal or a combination of two or more of polysilicon, a metal and a conductive silicide. Desirably, additional thin oxide spacers 51 are provided on the sidewalls of the gate conductors 47, the oxide spacers 51 formed, for example, by a thermal oxidation process. The locations of the extension/halo regions 15, 25 are desirably determined by the location and size of the gate conductors 47 and the thin oxide regions 51 which provide masking during implantations used to form such regions 15, 25. Similarly, the locations of the source/drain regions 24 are desirably determined by the gate conductors 47 and the dielectric spacers 49 which provide masking during the implantations used to form the source/drain regions 24.

Figure 1B:
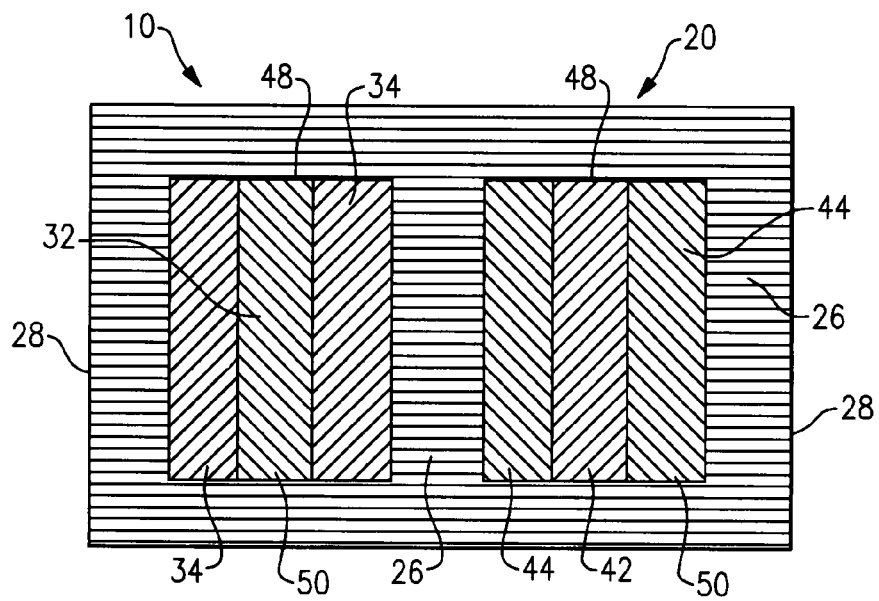

FIG. 1B is a corresponding sectional plan view of the structure shown in FIG. 1A, through lines 1B-1B of FIG. 1A. As best seen in FIG. 1B, shallow trench isolation (STI) region 26 is disposed as a moat surrounding the PFET 10 and the NFET 20 and isolating the PFET 10 from the NFET 20. As also shown in FIG. 1B, the tensile-stressed dielectric region 32, which underlies the PFET channel region 12, is provided as a continuous region of material extending between a first inner edge 48 and a second inner edge 50 of the STI region 26. The tensile-stressed dielectric regions 44 underlying the source/drain regions 24 of the NFET 20 are also provided as continuous regions of material extending between the first inner edge 48 and the second inner edge 50 of the STI region 26. Likewise, the compressive-stressed regions 34 underlying the source/drain regions of the PFET and the compressive-stressed region 42 underlying the channel region of the NFET are also disposed between the first and second inner edges of the STI region 26.

The PFET 10 and NFET 20 are conductively connected to each by way of conductive vias 164, 170 and horizontal interconnects 166, 172 in such manner as to form a circuit, e.g., a complementary metal oxide semiconductor (CMOS) inverter, for example, as will be described more fully below.

Figure 2A:
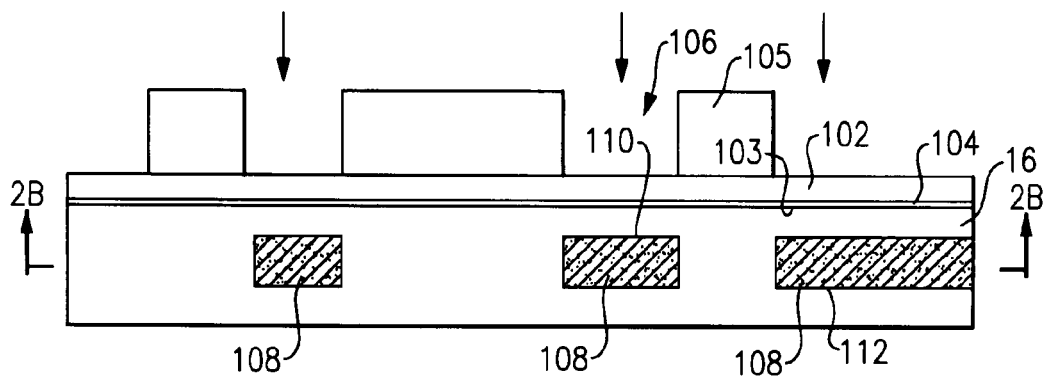
FIGS. 2A and 2B are a sectional view and a corresponding plan view through lines 2B-2B, respectively, illustrating a preliminary stage in a fabrication of an integrated circuit structure according to an embodiment of the invention.

FIGS. 2A through 9B illustrate stages in the fabrication of the transistor structure shown in FIGS. 1A-B. A preliminary stage of fabrication is illustrated in FIGS. 2A-B. A substrate is shown in FIG. 2A which includes a single-crystal layer 16 of a semiconductor such as silicon. Alternatively, the semiconductor can be a semiconductor alloy, e.g., silicon germanium (SiGe) or silicon carbide, or be a compound semiconductor such as any one of several III-V compound semiconductors, among which are gallium arsenide (GaAs), indium phosphide (InP), and many other such compounds, or the semiconductor can consist essentially of a II-VI compound semiconductor. FIG. 2A shows a stage in fabrication in which a pad layer 102, preferably consisting essentially of a dielectric material such as silicon nitride ($Si_3N_4$), is provided to overlie the single-crystal semiconductor layer 16. An additional pad oxide layer 104 may also be provided on the major surface 103 of the single-crystal layer 16, if desired. For ease of reference, the pad layer 102 together with the pad oxide layer 104, if any present, will be hereinafter referred to as pad stack 102, whether one such layer or both layers exist.

After the pad stack is provided, a mask layer 105, e.g., a photoresist, is patterned to form a series of openings overlying the pad stack 102 and the semiconductor layer 16. Thereafter, an implantation is performed through the openings 106 in the mask layer 105 to alter the characteristics of certain buried regions 108 of the single-crystal semiconductor layer 16. In the preferred embodiment in which the layer 16 consists essentially of silicon, an implantation of germanium (Ge) ions is performed to alter the crystalline silicon in the buried regions 108 in a way that makes the silicon more easily removed through etching than surrounding areas which are not implanted. Through control over the implantation energy and the concentration of Ge ions, the minimum depth 110 and maximum depth 112 of the implantation are controlled, as well as the density of implanted ions within the buried regions 108.

Figure 2B:
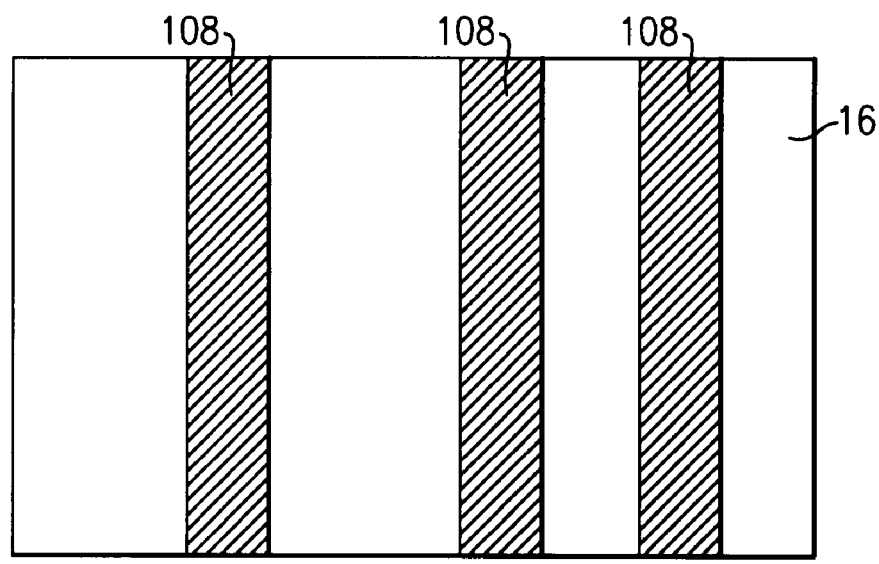

FIG. 2B is a corresponding sectional plan view of the single-crystal layer 16 through lines 2B-2B, after formation of the implanted buried regions 108. As shown therein, the mask patterns through which the implantations are performed are arranged such that the buried regions 108 are disposed as stripes which cross the single-crystal layer 16 in one direction across the single-crystal layer 16.

Thereafter, in a subsequent stage of fabrication shown in FIG. 3A, trenches 114 are patterned in the single-crystal semiconductor layer 16, the trenches 114 which will be subsequently filled with a dielectric such as silicon dioxide to form the shallow trench isolation (STI) regions. The trenches 114 are patterned by first patterning openings 116 in the pad stack 102, and thereafter etching the single-crystal layer 16 selectively to a material of the pad stack 102.

Figure 3A:
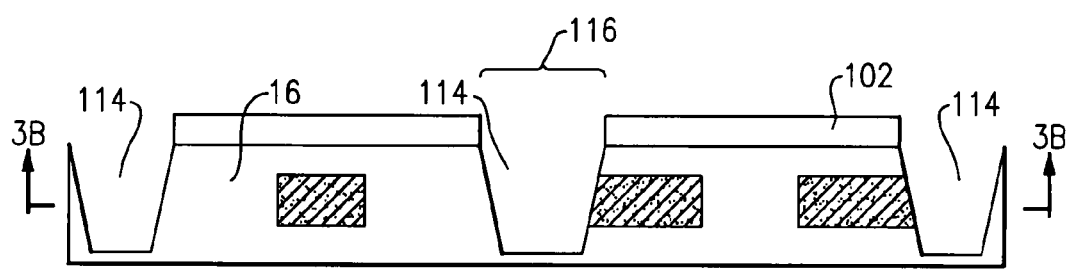
FIGS. 3A and 3B are a sectional view and a corresponding plan view through lines 3B-3B, respectively, illustrating a subsequent stage in a fabrication of an integrated circuit structure according to an embodiment of the invention.
Figure 3B:
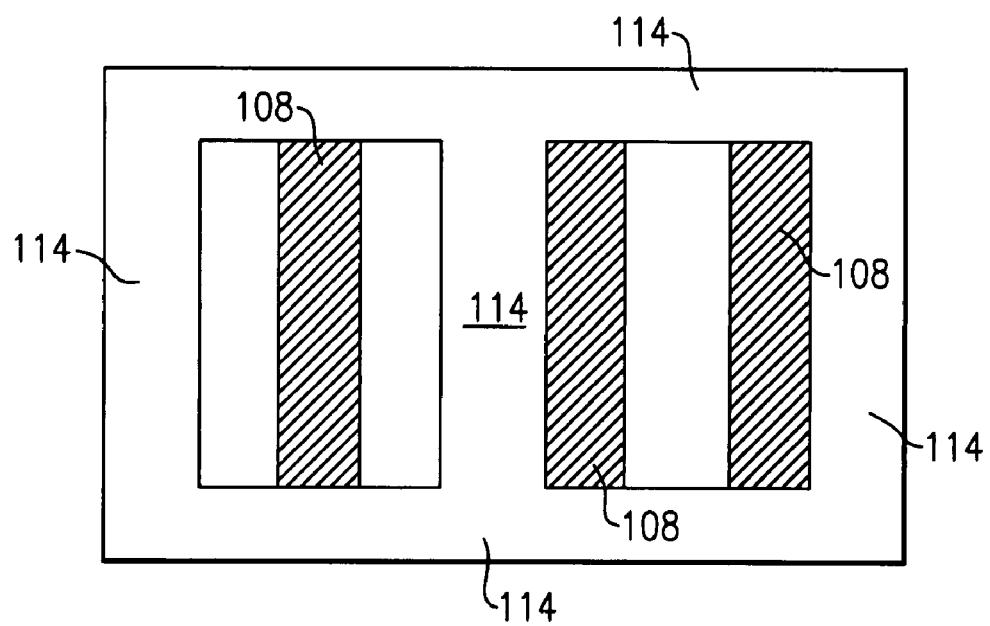

FIG. 3B is a plan view of the structure, through lines 3B-3B of FIG. 3A, showing the trenches 114 which now surround the Ge implanted buried regions 108 of the single-crystal layer 16.

Figure 4A:
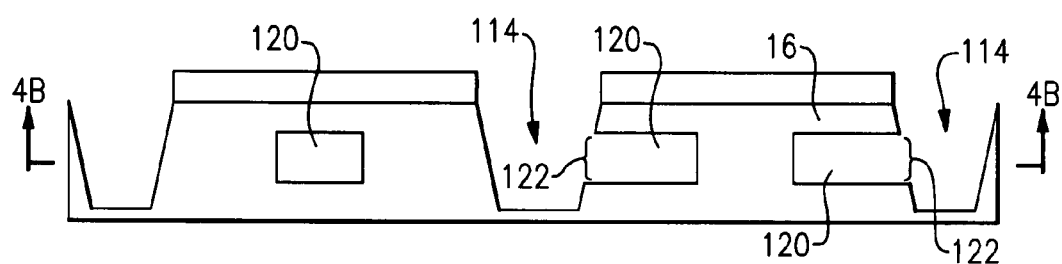
FIGS. 4A and 4B are a sectional view and a corresponding plan view through lines 4B-4B, respectively, illustrating a subsequent stage in a fabrication of an integrated circuit structure according to an embodiment of the invention.
Figure 4B:
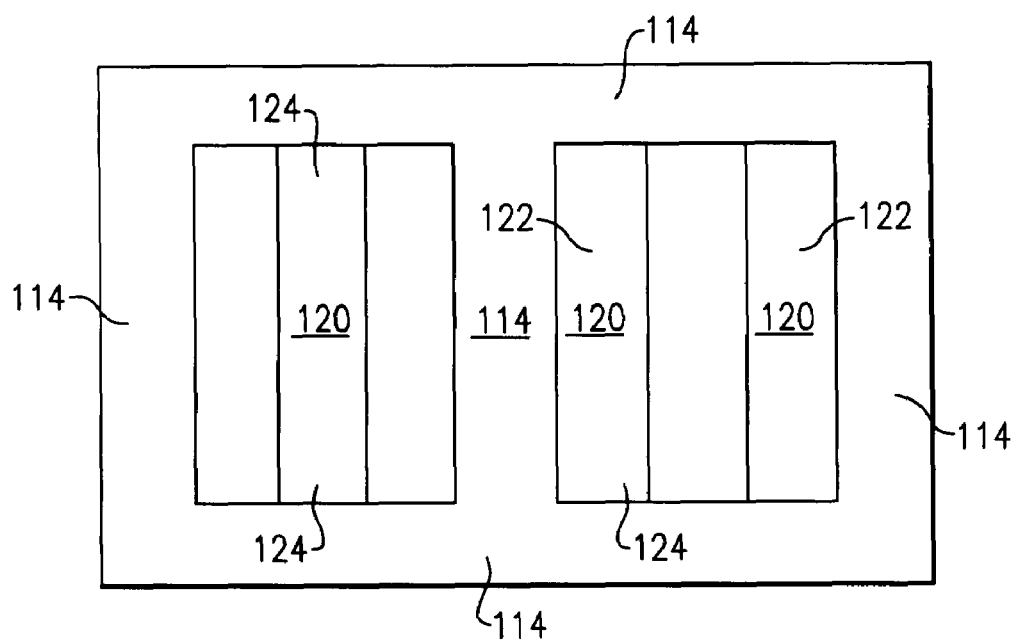

Thereafter, as shown in FIG. 4A, etching is performed to remove the Ge implanted regions from the substrate, in a manner that is performed selective to the unimplanted material of the single-crystal layer 16. This results in cavities 120 adjoining the trenches 114. Some of the cavities 120 have side openings 122 permitting the passage of material, e.g., a fluid, between the trenches 114 and the cavities 120. The side openings are also shown in FIG. 4B. As best seen in the subsurface plan view of FIG. 4B, all cavities 120 have end openings 124 through which material can pass to and from the STI trenches 114 into the ends of the cavities 120.

Figure 5A:
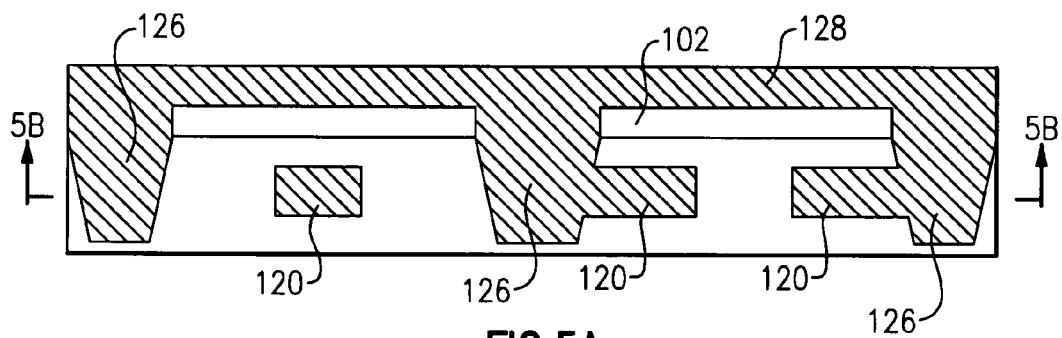
FIGS. 5A and 5B are a sectional view and a corresponding plan view through lines 5B-5B, respectively, illustrating a subsequent stage in a fabrication of an integrated circuit structure according to an embodiment of the invention.
Figure 5B:
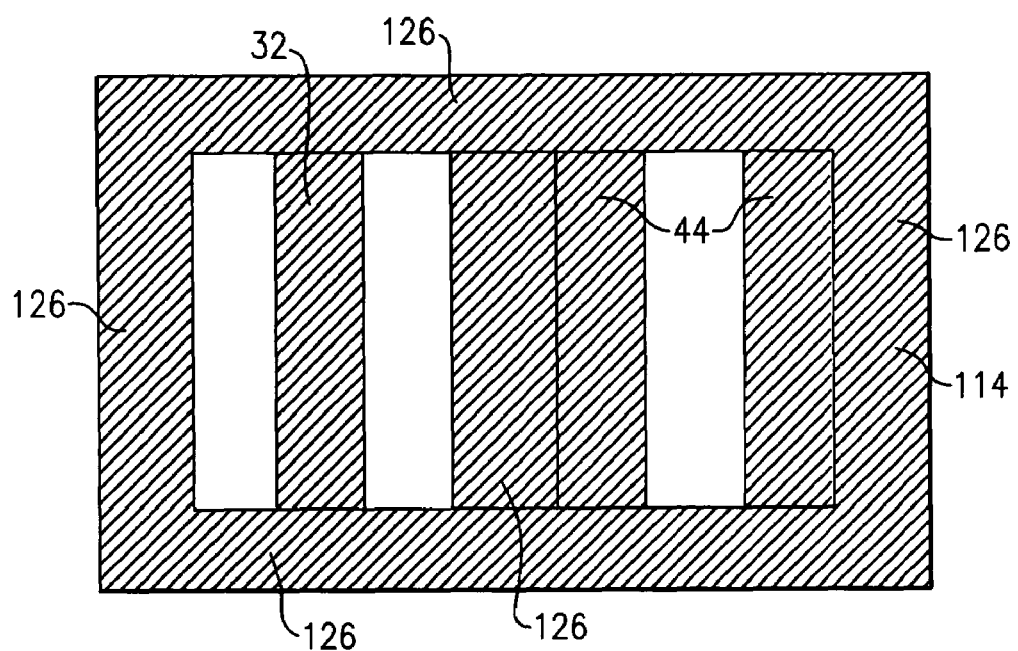

As further shown in FIGS. 5A-B, a deposition process is now performed to fill the cavities 120 with a compressive-stressed dielectric material. In one embodiment, the compressive-stressed material consists essentially of silicon nitride. Silicon nitride is advantageously used because the conditions under which it is deposited can, with relatively minor modifications, produce a film having an essentially neutral internal stress, a compressive stress, or alternatively, a tensile stress. Alternatively, an oxide of silicon, or any of many known varieties of materials known as "spin-on-glass" can be deposited and treated to acquire an internal stress. In the case of spin-on-glass, the internal stress is usually tensile. For this step of deposition, a compressive-stressed material 126 is deposited to fill the cavities 120 and the trenches 114 of the structure. Filling is performed through the side openings 122 and the end openings 124 that connect the cavities 120 to the trenches. The results of this deposition are the formation of buried compressive-stressed regions 32 and 44, as shown in the corresponding plan view (FIG. 5B), in locations once occupied by the cavities 120. In addition, this deposition results in the trenches being unavoidably filled at least partially with the compressive-stressed silicon nitride, as indicated at 126 in FIGS. 5A and 5B. As best seen in FIG. 5A, to ensure complete filling of the cavities 120, it may even be necessary to overfill the trenches such that the compressive-stressed material overlies the pad stack 102 of the structure, as shown at 128.

Figure 6A:
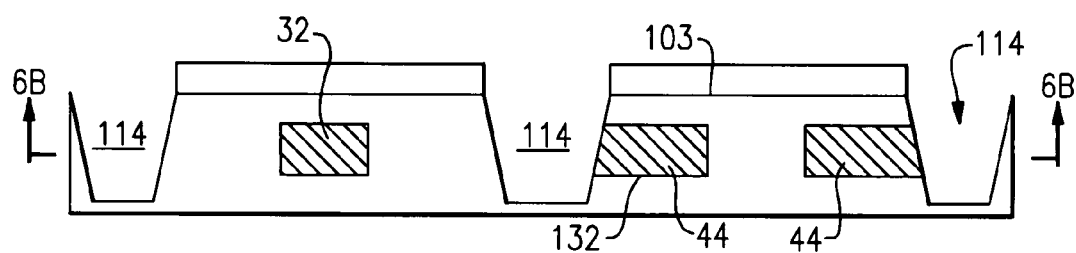
FIGS. 6A and 6B are a sectional view and a corresponding plan view through lines 6B-6B, respectively, illustrating a subsequent stage in a fabrication of an integrated circuit structure according to an embodiment of the invention.

Thereafter, as shown in FIG. 6A, an etchback process is conducted to at least substantially remove, or completely remove the compressive-stressed material from the trenches 114. This process is preferably conducted by anisotropic etching, e.g., through directional plasma etching or a reactive ion etch (RIE) which is performed in a direction normal to the major surface 103 of the single-crystal semiconductor layer 16. The etchback process is performed at least until the compressive-stressed material within the trenches 114 is recessed below a lower edge 132 of the buried compressive-stressed regions 32, 44. In this way, better control is maintained over the dimensions of the compressive-stressed regions 114. As illustrated in the corresponding plan view shown in FIG. 6B, the compressive stressed regions 32, 44 are now confined to the regions between a first edge 48 and a second edge 50 of the trenches 114 which will be subsequently filled to form the STI regions.

Subsequently, a series of processing steps are performed to create the tensile-stressed regions 34, 42 (FIG. 1A) which will be used to impart tensile stresses at appropriate locations to the subsequently formed transistors. Beginning in FIG. 7A, an additional implant is performed, such as through implantation of Ge ions, to create dislocations in a buried region 134 of the single-crystal semiconductor layer 16 of the substrate. This step can be performed without requiring a patterned mask above the pad stack 102 because the implantation does not significantly affect characteristics of the preexisting compressive stressed regions 32, 44 which lie at approximately the same depth as the newly implanted buried regions 134. As further shown in FIG. 7A, the minimum and maximum depths 136, 138 of the implanted buried regions 134 can be different than the minimum and maximum depths 137, 139 of the compressive-stressed regions 32, 44. Such control over the depths of the implanted regions 134 can be one parameter in controlling the amount of stress to be imparted by the tensile-stressed regions 34, 42 (FIG. 1A) which will be subsequently formed therein. During this implantation, a layer of a removable material such as a photoresist 140 can be provided within the trenches 114 to prevent ions form penetrating more deeply into the single-crystal region 16 of the substrate.

Figure 7A:
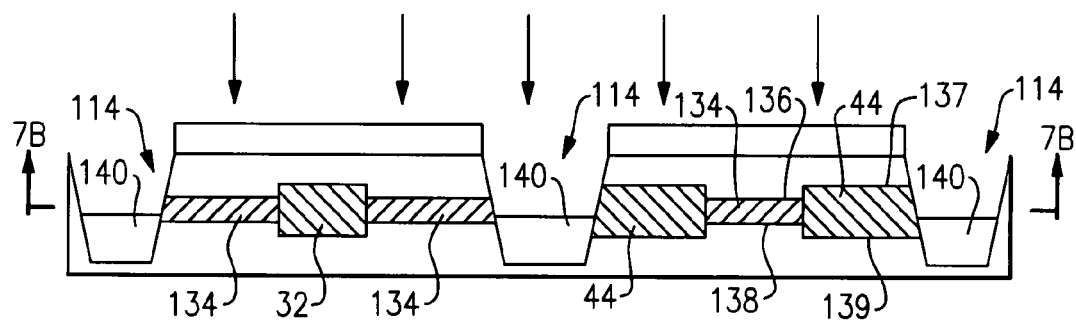
FIGS. 7A and 7B are a sectional view and a corresponding plan view through lines 7B-7B, respectively, illustrating a subsequent stage in a fabrication of an integrated circuit structure according to an embodiment of the invention.
Figure 6B:
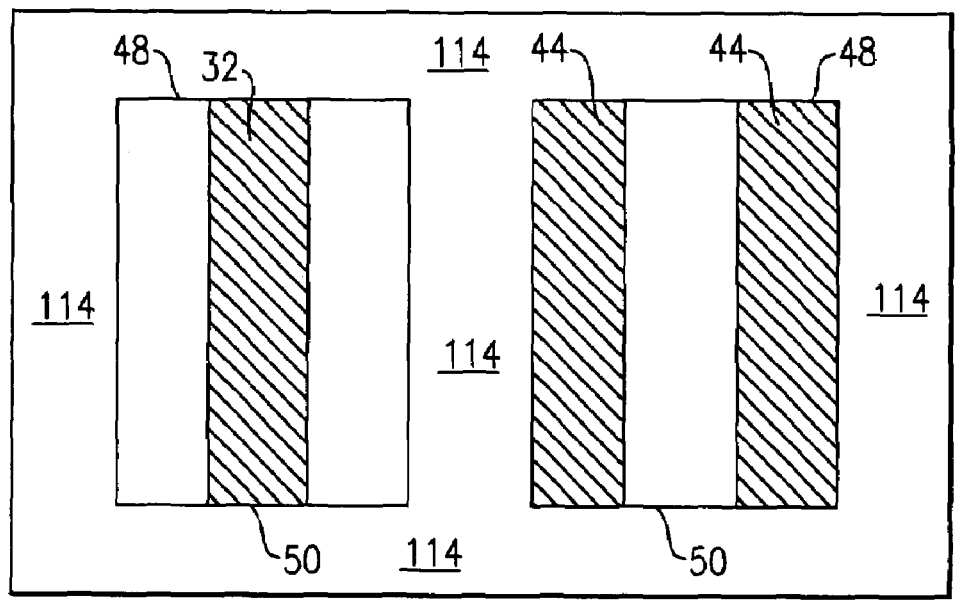
Figure 7B:
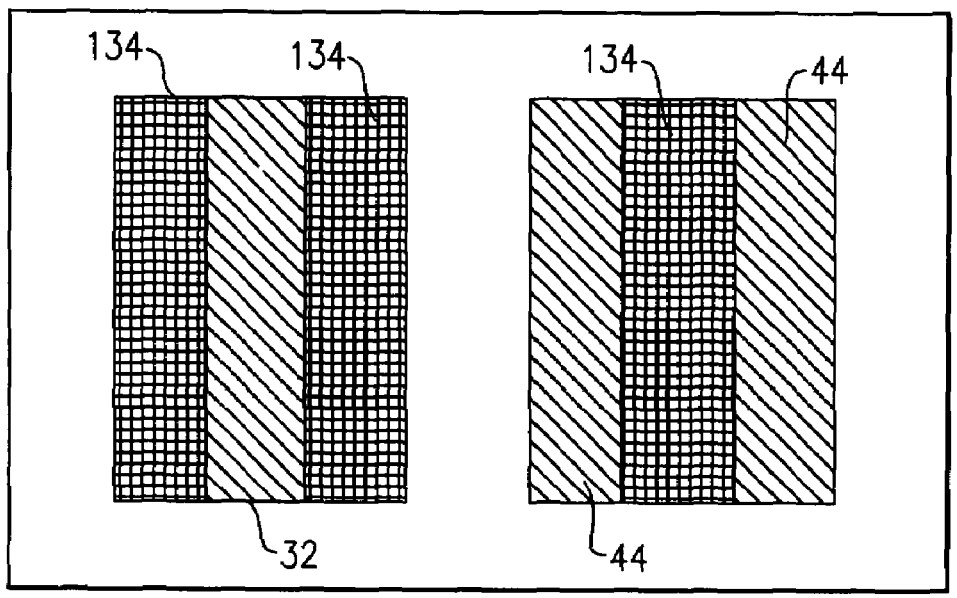

FIG. 7B is a corresponding plan view through FIGS. 7B-7B of FIG. 7A. As shown therein, elongated buried implanted regions 134 now adjoin and flank the sides of the compressive-stressed regions 32 and 44.

Figure 8A:
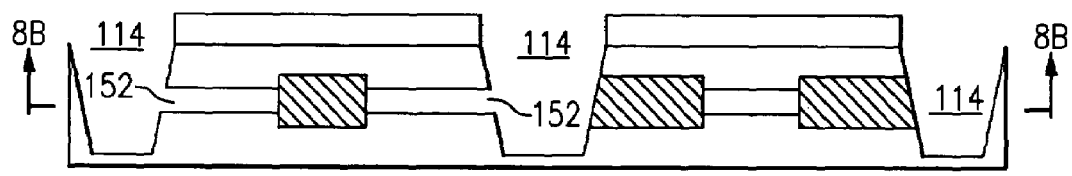
FIGS. 8A and 8B are a sectional view and a corresponding plan view through lines 8B-8B, respectively, illustrating a subsequent stage in a fabrication of an integrated circuit structure according to an embodiment of the invention.
Figure 8B:
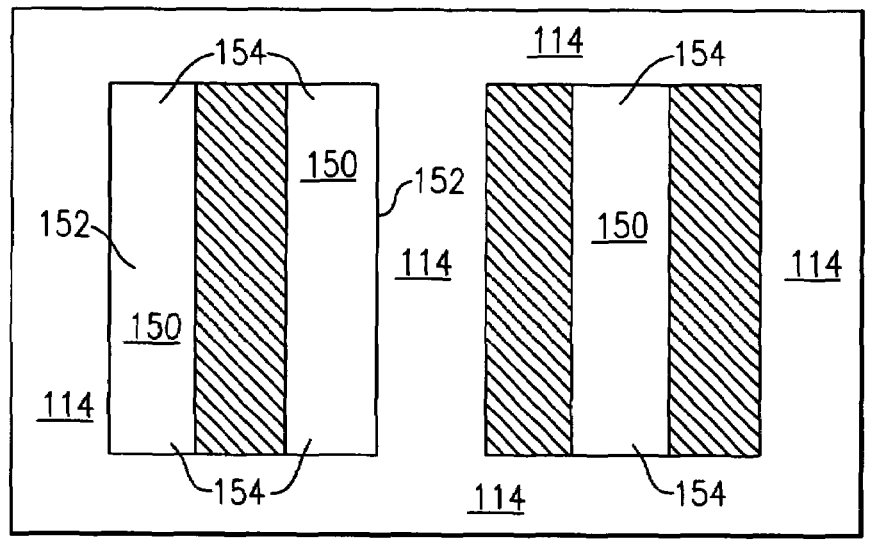

Thereafter, as shown in FIG. 8A, the implanted semiconductor material in the buried implanted regions 134 is removed, in a manner similar to that described above with reference to FIGS. 4A-4B to form cavities 150, the etching also being performed in a manner which is selective to the stressed dielectric material in regions 32 and 44 so as not to damage those areas. Some of the cavities 150 have side openings 152 which are open to the trenches 114. As best seen in FIG. 8B, all of the cavities have end openings 154 which are open to the trenches 114.

Figure 9A:
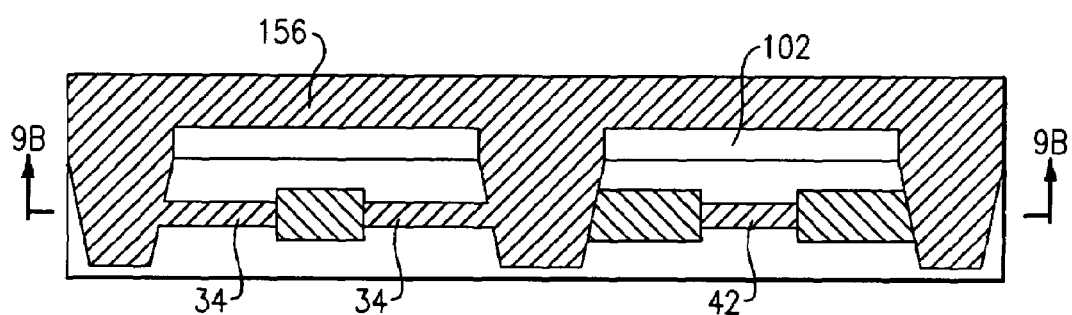
FIGS. 9A and 9B are a sectional view and a corresponding plan view through lines 9B-9B, respectively, illustrating a subsequent stage in a fabrication of an integrated circuit structure according to an embodiment of the invention.
Figure 9B:
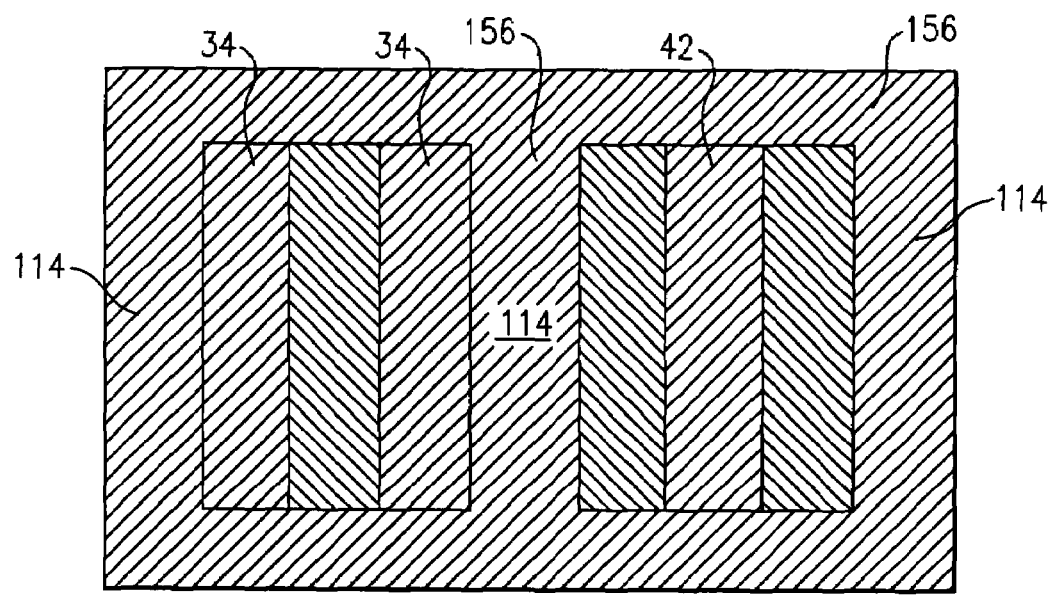

Thereafter, the cavities are filled with a tensile-stressed material, such as a tensile-stressed silicon nitride to form the structure as shown in FIG. 9A. As shown therein, tensile-stressed regions 34, 42 are now disposed in locations where the cavities 150 (FIG. 8A-B) once were. This process is preferably conducted to at least ensure that the prior cavities 150 are completely filled. Hence, the trenches 114 may be filled as a result of this deposition, and further overfilling can occur which results in the layer of tensile-stressed material 156 extending over the pad stack 102 of the structure. FIG. 9B is a corresponding plan view of the structure at this stage of processing, which shows the tensile-stressed material 156 in locations corresponding to the prior-etched trenches 114, as well as in the desired tensile-stressed regions 34, 42.

Subsequently, referring again to FIGS. 1A-1B, the tensile-stressed material that is disposed in the trenches is removed from the trenches, in a manner such as that described above with reference to FIGS. 6A-6B, and a dielectric is deposited to fill the trenches to form the STI regions 26. Preferably, a high-density plasma (HDP) oxide deposition process is used to form oxide STI regions 26, as shown in FIGS. 1A-1B. Further processing is thereafter conducted to form a gate dielectric 59, and gate conductors 47 overlying the gate dielectric 59 and the single-crystal semiconductor layer 16, after which oxide layers 51 are formed and the single-crystal layer 16 is implanted to form extension/halo regions 15, 25. The extension and halo regions 15, 25 of the PFET 10 and the NFET 20, respectively, are implanted by separate masked implantations. Thereafter, the spacers 49 are formed adjacent to the oxide layers 51, after which additional implantations are performed to form the source/drain regions 14 of the PFET 10 and the source/drain regions 24 of the NFET 20. This results in the source/drain regions of each of the PFET 10 and the NFET 20 being spaced from the gate conductors 47 by approximately the width of one of the spacers 49.

Thereafter, silicide regions 160 are formed to overlie the gate conductors and the source/drain regions 14, 24 of the PFET 10 and NFET 20, respectively, after which a dielectric region 162 is formed overlying both of the transistors. Further processing is then conducted to form interconnects to the transistors. In the example shown in FIG. 1A, the PFET 10 and the PFET 20 are connected to each other to form a circuit, such as a complementary metal oxide semiconductor (CMOS) inverter circuit. Thus, in such circuit, conductive vias 164 extend vertically from a horizontally disposed interconnect 166 to form a connection between the gates of the two transistors. In addition, conductive vias 170 extend vertically from a horizontally disposed interconnect 172 to form a connection between the source/drain regions of the two transistors, e.g., to form the required connections of the input terminal or output terminal of the CMOS inverter.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A semiconductor fabrication method, comprising:
    forming a first stressed region having a first type of stress underlying a first portion of an active semiconductor region, said first type of stress being either compressive type or tensile type;

forming second stressed regions having a second type of stress underlying second portions of said active semiconductor region, said second type of stress being an opposite one of the compressive type and tensile type as the first type of stress, wherein said second stressed regions not underlying said first stressed region; and forming a field effect transistor having a channel region in said first portion of said active semiconductor region and having source and drain regions in said second portions.

2. A fabrication method as claimed in claim 1, wherein said first stressed region includes an elongated buried stressed region at least substantially coinciding with an area of said channel region.

3. A fabrication method as claimed in claim 2, wherein said buried stressed region includes a stressed dielectric region.

4. A fabrication method as claimed in claim 3, wherein said stressed dielectric region consists essentially of at least one material selected from the group consisting of silicon nitride, silicon oxide and spin-on-glass.

5. A fabrication method as claimed in claim 2, wherein said second stressed regions at least substantially coincide with an area of said source and drain regions.

6. A fabrication method as claimed in claim 5, further comprising forming an isolation region at least substantially surrounding said area of said source and drain regions and said area of said channel region.

7. A fabrication method as claimed in claim 6, wherein said channel region is disposed entirely over said first stressed region and said source and drain regions are disposed entirely over said second stressed regions.

8. A fabrication method as claimed in claim 7, wherein said FET is an n-type FET, said first type of stress being compressive type, and said second type of stress being tensile type.

9. A fabrication method as claimed in claim 8, wherein said first stressed region fully occupies said area of said channel region and said second stressed regions fully occupy said areas of said source and drain regions.

10. A fabrication method as claimed in claim 6, wherein said FET is an p-type FET, said first type of stress being tensile type, and said second type of stress being compressive type.

11. A fabrication method as claimed in claim 10, wherein said first stressed region fully occupies said area of said channel region and said second stressed regions fully occupy said areas of said source and drain regions.

12. A semiconductor fabrication method, comprising:
forming a field effect transistor (FET) having a channel region and source and drain regions adjacent to said channel region, a first stressed region having a first type of stress underlying said channel region, said first type of stress being either compressive type or tensile type, and second stressed regions having a second type of stress underlying said source and drain regions, said second type of stress being an opposite one of the compressive type and tensile type as the first type of stress, said second stressed regions not underlying said first stressed region.

13. A fabrication method as claimed in claim 12, wherein said first stressed region includes an elongated buried stressed region at least substantially coinciding with an area of said channel region.

14. A fabrication method as claimed in claim 13, wherein said buried stressed region includes a stressed dielectric region.

15. A fabrication method as claimed in claim 14, wherein said stressed dielectric region consists essentially of at least one material selected from silicon nitride, silicon oxide and spin-on-glass.

16. A fabrication method as claimed in claim 12, wherein said second stressed regions at least substantially coincide with an area of said source and drain regions.

17. A semiconductor fabrication method, comprising:
forming a p-type field effect transistor (PFET) and an n-type field effect transistor, the PFET having a PFET channel region and p-type source and drain regions adjacent to said PFET channel region, a first tensile stressed region underlying said PFET channel region, and first compressive stressed regions underlying said p-type source and drain regions, wherein said first compressive stressed region not underlying said first tensile stressed region, the NFET having an NFET channel region and n-type source and drain regions adjacent to said n-type channel region, a second compressive stressed region underlying said NFET channel region, and second tensile stressed regions underlying said n-type source and drain regions of said NFET, wherein said second tensile stressed region not underlying said second compressive stressed region.

18. A fabrication method as claimed in claim 17, wherein said first tensile stressed region includes an elongated buried stressed region at least substantially coinciding with an area of said PFET channel region.

19. A fabrication method as claimed in claim 17, wherein said PFET and said NFET are conductively connected together in a circuit operable to perform a function.

20. A fabrication method as claimed in claim 17, wherein said buried stressed region includes a stressed dielectric region.

* * * * *